(12) United States Patent
Tsujimoto et al.

(10) Patent No.: US 8,383,000 B2
(45) Date of Patent: Feb. 26, 2013

(54) SUBSTRATE PROCESSING APPARATUS, METHOD FOR MEASURING DISTANCE BETWEEN ELECTRODES, AND STORAGE MEDIUM STORING PROGRAM

(75) Inventors: Hiroshi Tsujimoto, Yamanashi (JP); Makoto Kobayashi, Hsin-chu (TW); Jun Tamura, Yamanashi (JP); Nobuhiro Wada, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 97 days.

(21) Appl. No.: 12/958,877

(22) Filed: Dec. 2, 2010

(65) Prior Publication Data

US 2011/0132873 A1    Jun. 9, 2011

Related U.S. Application Data

(60) Provisional application No. 61/296,295, filed on Jan. 19, 2010.

(30) Foreign Application Priority Data

Dec. 4, 2009  (JP) .................................. 2009-276239

(51) Int. Cl.
*G01L 21/30* (2006.01)
*G01R 31/00* (2006.01)

(52) U.S. Cl. .............................. 216/59; 216/67; 438/689

(58) Field of Classification Search .................... 216/59, 216/67; 438/689
See application file for complete search history.

(56) References Cited

U.S. PATENT DOCUMENTS

2008/0182412 A1 *  7/2008  Bailey, III et al. ............ 438/689

FOREIGN PATENT DOCUMENTS

| JP | 07183280 | 7/1995 |
|---|---|---|
| JP | 2003188145 | 7/2003 |
| JP | 2003332314 | 11/2003 |
| JP | 2004335841 | 11/2004 |

* cited by examiner

*Primary Examiner* — Nadine Norton
*Assistant Examiner* — Mahmoud Dahimene
(74) *Attorney, Agent, or Firm* — Turocy & Watson, LLP

(57) ABSTRACT

A distance between electrodes can be accurately measured by using a lifter. A substrate processing apparatus includes an upper electrode 120 and a lower electrode 310 facing each other within a processing chamber 102; a lift pin 332 that is protrusible from and retractable below the lower electrode and lifts up a substrate mounted on the lower electrode to be separated from the lower electrode; a lifter 330 that elevates the lift pin up and down; and a controller 400 that elevates the lift pin upward and brings the lift pin into contact with the upper electrode by driving the lifter while the substrate is not mounted on the lower electrode and measures a distance between the electrodes based on a moving distance of the lifter.

11 Claims, 12 Drawing Sheets

SUBSTRATE PROCESSING APPARATUS, METHOD FOR MEASURING DISTANCE BETWEEN ELECTRODES, AND STORAGE MEDIUM STORING PROGRAM

CROSS-REFERENCE TO RELATED APPLICATION

This application claims the benefit of Japanese Patent Application No. 2009-276239 filed on Dec. 4, 2009, and U.S. Provisional Application Ser. No. 61/296,295 filed on Jan. 19, 2010, the entire disclosures of which are incorporated herein by reference.

FIELD OF THE INVENTION

The present disclosure relates to a substrate processing apparatus that performs a plasma process on a substrate by generating plasma between electrodes facing each other and also relates to a method for measuring a distance between the electrodes and a storage medium storing a program.

BACKGROUND OF THE INVENTION

As a substrate processing apparatus for manufacturing semiconductor devices, there has been widely employed a parallel plate type plasma processing apparatus having a lower electrode for mounting thereon a substrate such as a semiconductor wafer or a liquid crystal substrate and an upper electrode facing the lower electrode within a processing chamber. In such a plasma processing apparatus, a substrate is mounted on the lower electrode, and a processing gas is introduced into the processing chamber. Then, plasma is generated between the electrodes, and a plasma process such as etching or film formation is performed on the substrate by the plasma.

In such a parallel plate type plasma processing apparatus, since plasma is generated between the electrodes, a surface of an electrode plate of the upper electrode is exposed to the plasma and is worn out, so that a distance between the electrodes is varied (see, for example, Patent Document 1). If the distance between the electrodes is varied too much, such a variation may have an adverse effect on process properties of the substrate. Thus, it is required to replace the electrode plate of the upper electrode at a proper timing.

For the purpose, conventionally, it has been attempted to calculate a consumption amount of consumables such as an electrode plate based on cumulative usage history of the plasma processing apparatus or by using multivariate analysis (see, for example, Patent Document 2). For example, in order to estimate the consumption amount based on the usage status of the plasma processing apparatus, the consumption amount of the consumables has been calculated by measuring an electric discharge time of a high frequency power (RF electric discharge time) applied to the electrode plate. If this RF electric discharge time exceeds a preset threshold value, an alarm has been automatically activated or an instruction for replacing the consumables has been provided to manage the consumables.

Patent Document 1: Japanese Patent Laid-open Publication No. 2003-332314

Patent Document 2: Japanese Patent Laid-open Publication No. 2004-335841

In recent years, however, processing conditions for performing a plasma process have been diversified and environment within a processing chamber has been complicated. Thus, it has been getting difficult to accurately calculate the consumption amount of the electrode plate. Furthermore, since there is an increasing demand for miniaturization of devices formed on a substrate, even a slight variation of a distance between the electrodes may not be neglected.

BRIEF SUMMARY OF THE INVENTION

In view of the foregoing, the present disclosure provides a substrate processing apparatus capable of precisely measuring a distance between electrodes.

In accordance with an aspect of the present disclosure, there is provided a method for measuring a distance between an upper electrode and a lower electrode provided within a processing chamber to face each other in a substrate processing apparatus that performs a preset process on a substrate mounted on the lower electrode by applying a high frequency power between the electrodes and generating plasma of a preset gas. Here, the substrate processing apparatus includes a lift pin that is protrusible from and retractable below the lower electrode and lifts up the substrate to be separated from the lower electrode; and a lifter that elevates the lift pin up and down. The method for measuring a distance between electrodes includes elevating the lift pin upward and bringing the lift pin into contact with the upper electrode by driving the lifter while the substrate is not mounted on the lower electrode and measuring a distance between the upper electrode and the lower electrode based on a moving distance of the lifter.

In accordance with another aspect of the present disclosure, there is provided a substrate processing apparatus that, within a processing chamber including an upper electrode and a lower electrode facing each other, performs a preset process on a substrate mounted on the lower electrode by applying a high frequency power between the electrodes and generating plasma of a preset gas. The substrate processing apparatus includes a lift pin that is protrusible from and retractable below the lower electrode and lifts up the substrate mounted on the lower electrode to be separated from the lower electrode; a lifter that elevates the lift pin up and down; and a controller that elevates the lift pin upward and brings the lift pin into contact with the upper electrode by driving the lifter while the substrate is not mounted on the lower electrode and measures a distance between the upper electrode and the lower electrode based on a moving distance of the lifter.

With this configuration of the present disclosure, since the distance between the electrodes can be directly measured by lifting up the lift pin to the upper electrode, the measurement can be performed exactly. Further, it is not needed to additionally install a unit for measuring the distance between the electrodes, and, thus, the configuration of the apparatus is not complicated and the manufacturing cost can be reduced. The consumption amount of the electrode plate of the upper electrode can be detected precisely, and, thus, a more appropriate replace time of the electrode plate can be known.

Further, the substrate processing apparatus may further include a driving mechanism that elevates the upper electrode up and down, and a position of the upper electrode may be corrected by controlling the driving mechanism to adjust the distance between the electrodes to a preset distance previously stored in a storage unit based on the measured distance between the electrodes. In this case, in measuring the distance between the electrodes, the distance between the electrodes may be measured by elevating the lift pin upward after the upper electrode is lowered to a preset position, and the upper electrode may be returned to an original position and the position of the upper electrode may be corrected.

Further, a variation of the measured distance between the electrodes from the preset distance may be calculated, and it may be determined whether the variation is within a tolerance range, and the position of the upper electrode may be corrected only when the variation is within the tolerance range. Furthermore, a variation of the measured distance between the electrodes from the preset distance may be calculated, and it may be determined whether the variation is within a tolerance range, and an alarm may be activated when the variation exceeds the tolerance range. With this configuration, a position of the upper electrode is corrected if a variation of a distance between electrodes is within a tolerance range, and the electrode plate may be replaced if the variation exceeds the tolerance range due to the excessive erosion of the electrode plate.

Further, the substrate processing apparatus may further include a lifter sensor that detects a status of the lifter. The method may further include: in measuring the distance between the electrodes, monitoring an output of the lifter sensor from the beginning of the elevation of the lift pin and detecting a contact time when the lift pin comes into contact with the upper electrode based on a variation of the output of the lifter sensor. The moving distance of the lifter may be measured based on a time duration from the beginning of the elevation of the lift pin until the detected contact time. With this configuration, if the substrate is in contact with the upper electrode, the lifter is not moved anymore, so that the contact time can be easily determined by monitoring the movement of the lifter.

In this case, the lifter may include a base that supports the lift pin and a motor that elevates the base up and down, and the lifter sensor may be a torque sensor that detects a load torque of the motor. Here, in detecting the contact time, an output of the torque sensor may be monitored from the beginning of the elevation of the lift pin, and a time when the torque of the motor rapidly increases after the lift pin is elevated may be determined as the contact time when the lift pin comes into contact with the upper electrode.

The lifter sensor may be a vibration sensor that detects a driving vibration of the motor. Here, in detecting the contact time, an output of the vibration sensor may be monitored from the beginning of the elevation of the lift pin, and a time when the driving vibration of the motor is not detected any more may be determined as the contact time when the lift pin comes into contact with the upper electrode.

Further, the lifter sensor may be a sound sensor that detects a driving sound of the motor. Here, in detecting the contact time, an output of the sound sensor may be monitored from the beginning of the elevation of the lift pin, and a time when the driving sound of the motor is not detected any more may be determined as the contact time when the lift pin comes into contact with the upper electrode.

Furthermore, the lifter sensor may be a temperature sensor that detects a temperature of the motor. Here, in detecting the contact time, an output of the temperature sensor may be monitored from the beginning of the elevation of the lift pin, and a time when a temperature rise of the motor exceeds a preset value may be determined as the contact time when the lift pin comes into contact with the upper electrode.

Furthermore, the lifter sensor may be a position sensor that detects a position of the base. Here, in detecting the contact time, an output of the position sensor may be monitored from the beginning of the elevation of the lift pin, and a time when the position of the base reaches a preset raised position may be determined as the contact time when the lift pin comes into contact with the upper electrode.

In order to solve the problems, in accordance with still another aspect of the present disclosure, there is provided a computer readable storage medium that stores therein a program for implementing, on a computer, the above-mentioned methods for measuring a distance between electrodes.

In accordance with the present disclosure, it is possible to more accurately calculate a distance between the electrodes by directly measuring the distance between the electrodes by using the lifter without employing complicated components.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
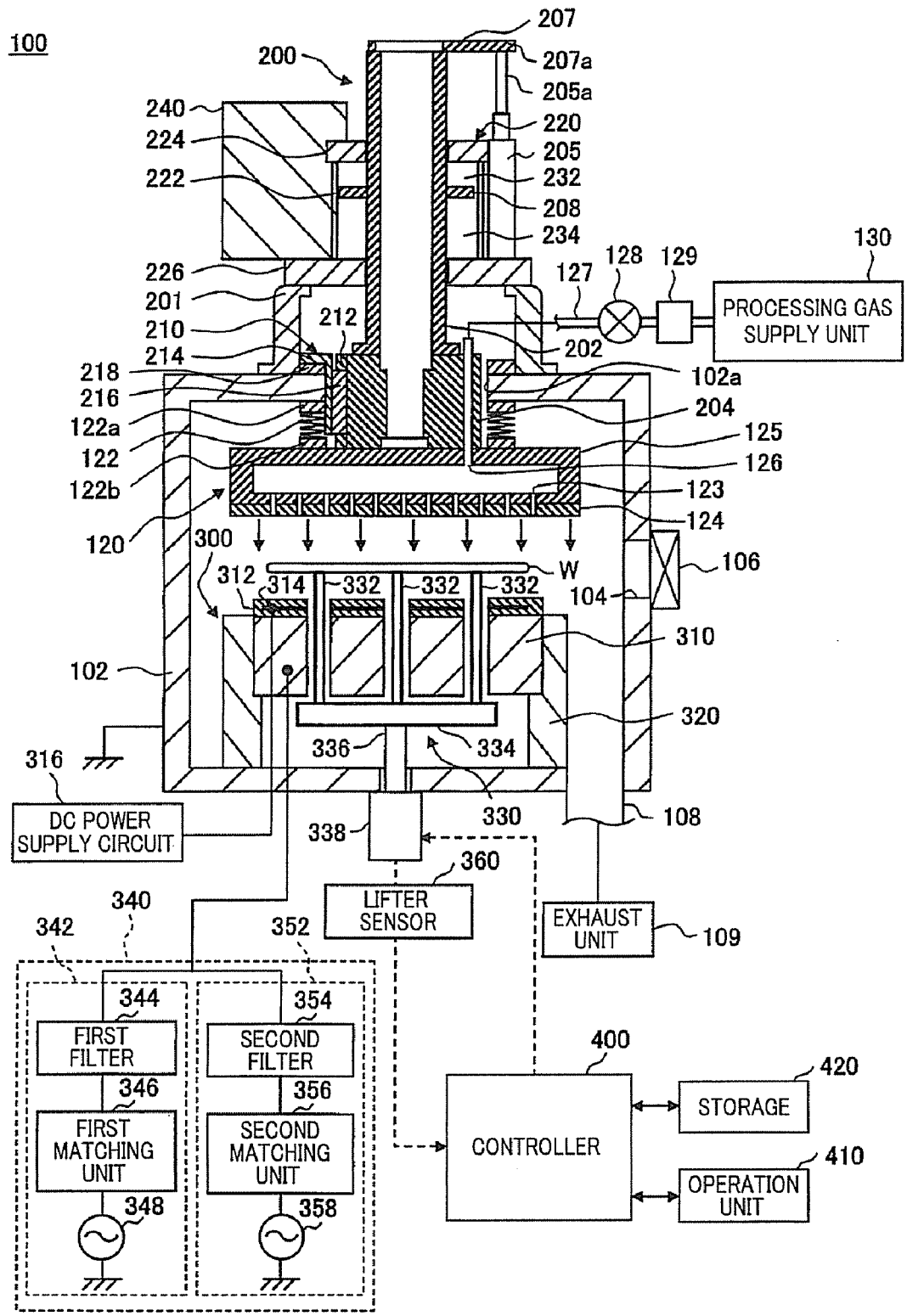
FIG. 1 is a cross sectional view illustrating an example configuration of a substrate processing apparatus in accordance with an embodiment of the present disclosure.

Hereinafter, embodiments of the present invention will be described in detail with reference to the accompanying drawings. In the drawings, like reference numerals denote like parts through the whole document.

As an example of a substrate processing apparatus, FIG. 1 illustrates a schematic configuration of a parallel plate type substrate processing apparatus 100 in accordance with an embodiment of the present disclosure. For example, the substrate processing apparatus 100 has a cylindrical processing chamber 102 made of, e.g., aluminum of which surface is anodically oxidized (alumite treated). The processing chamber 102 is grounded.

In the processing chamber 102, an upper electrode 120 serving as a shower head for introducing a processing gas or a purge gas is provided, and a lower electrode (susceptor) 310 serving as a mounting table 300 for mounting thereon a wafer W is provided so as to face the upper electrode 120.

In accordance with the present embodiment of the present disclosure, the upper electrode 120 is configured to be driven in one direction, e.g., in a vertical direction, by an upper electrode driving unit 200. With this configuration, a distance between the lower electrode 310 and the upper electrode 120 can be controlled. The upper electrode driving unit 200 will be described in detail later.

The upper electrode 120 is supported by an upper inner wall of the processing chamber 102 via a bellows 122. The bellows 122 is installed on the upper inner wall of the processing chamber 102 by a fixing member such as a bolt via a ring-shaped upper flange 122a and installed on a top surface of the upper electrode 120 by a fixing member such as a bolt via a ring-shaped upper flange 122b.

The upper electrode 120 is composed of an electrode plate 124 serving as a facing surface to the lower electrode 310 and having a plurality of discharge holes 123, and an electrode support 125 for supporting the electrode plate 124. The electrode plate 124 is made of, e.g., quartz, and the electrode support 125 is made of conductive material such as aluminum of which surface is alumite treated.

In the electrode support 125 of the upper electrode 120, a gas inlet 126 is provided. The gas inlet 126 is connected to a gas supply line 127. The gas supply line 127 is connected with a processing gas supply unit 130 via a valve 128 and a mass flow controller 129.

For example, the processing gas supply unit 130 supplies an etching gas for plasma etching. Further, although FIG. 1 shows only one processing gas supply mechanism including the gas supply line 127, the valve 128, the mass flow controller 129, and the processing gas supply unit 130, the substrate processing apparatus 100 may have a plurality of processing gas supply mechanisms. By way of example, a processing gas such as $CHF_3$, Ar, or He is independently supplied into the processing chamber 102 at a controlled flow rate.

Hereinafter, the upper electrode driving unit 200 is described in detail. The upper electrode driving unit 200 includes a substantially cylindrical slidable supporting member 204 for slidably supporting the upper electrode 120 relative to the processing chamber 204. The slidable supporting member 204 is fixed at a substantial center of the top of the upper electrode 120 by a bolt or the like.

The slidable supporting member 204 is installed to be slidably movable through a hole 102a formed in a substantially center portion of an upper wall of the processing chamber 102. To be specific, an outer surface of the slidable supporting member 204 is slidably supported on an edge of a hole 102a of the processing chamber 102 via a sliding unit 210.

For example, the sliding unit 210 includes a guide member 216 fixed to a vertical part of a fixing member 214 having an L-shaped cross section at an upper part of the processing chamber 102; and a rail 212 provided on the outer surface of the slidable supporting member 204 in one direction (in a vertical direction in accordance with this embodiment) to be slidably supported by the guide member 216.

A horizontal part of the fixing member 214 for fixing the guide member 216 of the sliding unit 210 is mounted on the top of the processing chamber 102 via a ring-shaped horizontal adjusting plate 218. The horizontal adjusting plate 218 is configured to adjust a horizontal position of the upper electrode 120. By way of example, the horizontal adjusting plate 218 is fixed to the processing chamber 102 by a plurality of bolts arranged at a same interval in a circumferential direction, so that an inclination of the horizontal adjusting plate 218 with respect to a horizontal direction may be varied depending on a protruded height of the bolts. That is, by adjusting an inclination of the horizontal adjusting plate 218 with respect to the horizontal direction, an inclination of the guide member 216 of the sliding unit 210 with respect to a vertical direction is adjusted. Therefore, an inclination of the upper electrode 120 supported via the guide member 216 with respect to a horizontal direction can be adjusted. Accordingly, a horizontal position of the upper electrode 120 can be maintained by a relatively simple manipulation.

A pneumatic cylinder 220 for driving the upper electrode 120 is installed above the processing chamber 102 via a cylindrical body 201. A lower end of the cylindrical body 201 is airtightly sealed to cover the hole 102a of the processing chamber 102 by a bolt. An upper end of the cylindrical body 201 is airtightly sealed with a lower end of the pneumatic cylinder 220.

The pneumatic cylinder 220 has a rod 202 movable in one direction, and a lower end of the rod 202 is connected with a substantially central portion of the top of the slidable supporting member 204 by a bolt. By driving the rod 202 of the pneumatic cylinder 220, the slidable supporting member 204 allows the upper electrode 120 to be moved in one direction along the sliding unit. The rod 202 has a cylinder shape, and the inner space of the rod 202 communicates with a center hole formed in a substantially center of the slidable supporting member 204, and is opened to air. Thus, for example, wires (not shown in FIG. 1) such as ground wires may be connected to the upper electrode 120 via the inner space of the rod 202 and the center hole of the slidable supporting member 204.

On a side of the pneumatic cylinder 220, a linear encoder 205 as a position detecting unit for detecting a position of the upper electrode 120 is provided. Meanwhile, on a top portion of the rod 202 of the pneumatic cylinder 220, an upper member 207 having an extended part 207a extended from the rod 202 in a lateral direction is provided, and the extended part 207a of the upper member 207 is in contact with a detector 205a of the linear encoder 205. Since the upper member 207 is moved along with the upper electrode 120, a position of the upper electrode 120 can be detected by the linear encoder 205.

The pneumatic cylinder 220 includes a cylinder main body 222 which is sandwiched between an upper supporting plate 224 and a lower supporting plate 226. On an outer surface of the rod 202, a ring-shaped partition member 208 for dividing the inside of the pneumatic cylinder 220 into an upper space 232 and a lower space 234.

A compressed air is introduced from an upper port (not shown) into the upper space 232 of the pneumatic cylinder 220. Further, a compressed air is introduced from a lower port (not shown) into the lower space 234 of the pneumatic cylinder 220. By controlling an amount of an air introduced into the upper space 232 and the lower space 234, respectively, the rod 202 is moved in one direction (i.e., a vertical direction). The air amount introduced into the pneumatic cylinder 220 is controlled by a pneumatic circuit 240 provided in the vicinity of the pneumatic cylinder 220.

The lower electrode 310 is made of, e.g., aluminum and is installed in a bottom portion of the processing chamber 102 via a cylindrical insulating supporter 320. Further, the lower electrode 310 is formed in a circular column shape conforming to an outer diameter of a wafer W.

An electrostatic chuck 312 for holding the wafer mounted on the lower electrode 310 is provided on a top surface of the lower electrode 310 by an electrostatic attracting force generated by applying a DC voltage. By way of example, the electrostatic chuck 312 includes an electrostatic chuck electrode 314 having a conductive film such as a copper film between two high molecular polyimide films or ceramics, and the electrostatic chuck electrode 314 is insulated.

The electrostatic chuck electrode 314 is connected with a DC power supply circuit 316 capable of converting an output voltage into a positive voltage, a negative voltage, or a ground voltage. Further, the DC power supply circuit 316 is configured to adjust a level of a positive voltage or a negative voltage. The DC power circuit 316 applies a high voltage to the electrostatic chuck electrode 314, so that the wafer W can be attracted to and held on the top surface of the electrostatic chuck 312 by a coulomb force.

The lower electrode 310 includes a lifter 330 that lifts up the wafer W to separate the wafer from the top surface of the electrostatic chuck 312 by using lift pins (lifter pins or supporting pins) 332. The lifter 330 includes a base 334 for supporting a plurality of, e.g., three lift pins 332 standing upright, and a motor 338 for moving up and down the rod 336 such as a ball screw connected to the base 334. As such a motor, for example, a DC motor or a stepping motor may be used. Also, an elevating mechanism for the lifter 330 is not limited thereto, but the lifter 330 may be elevated by a linear motor, for example.

The lift pins 332 are vertically extended upward from a bottom portion of the lower electrode 310 and are protruded or retracted from the top surface of the electrostatic chuck 312. Specifically, the lift pins 332 are inserted into holes formed through the lower electrode 310 and the electrostatic chuck 312 and are protruded and retracted from the top surface of the electrostatic chuck 312 according to an elevating operation of the base 334. The base 334 is formed, e.g., in a circular plate or ring shape, and the lift pins 332 are arranged on a top of the base 334 at a same interval. The number of lift pins 332 is not limited to three.

In the lifter 330 configured as described above, the lift pins 332 are moved up by the base 334, thereby lifting up the wafer W in parallel with the electrostatic chuck 312 to separate the wafer from the electrostatic chuck 312. Such an operation of the lifter 330 will be described in detail below.

Moreover, although not shown in the drawing, the mounting table 300 may include, for example, a temperature control unit such as a heater or a coolant path, or a heat transfer gas supply unit for supplying a heat transfer gas (He gas) for accelerating a heat transfer between the top surface of the electrostatic chuck 312 and a rear surface of the wafer W and, if necessary, the mounting table 300 may have various functions. Meanwhile, a ring-shaped focus ring (not shown) made of, e.g., quartz or silicon, and surrounding the wafer W may be installed on a top surface of the cylindrical supporter 320.

The lower electrode 310 is connected with a power supply device 340 for supplying double frequency powers. The power supply device 340 includes a first high frequency power supply unit 342 for supplying a first high frequency power of a first frequency (high frequency power for plasma generation) and a second high frequency power supply unit 352 for supplying a second high frequency power (high frequency power for a bias voltage) of a second frequency which is lower than the first frequency.

The first high frequency power supply unit 342 includes a first filter 344, a first matching unit 346 and a first power supply 348, which are connected with the lower electrode 310 in sequence. The first filter 344 prevents a power component of the second frequency from entering the first matching unit 346. The first matching unit 346 performs the matching for the first high frequency power component.

The second high frequency power supply unit 352 includes a second filter 354, a second matching unit 356 and a second power 358, which are connected with the lower electrode 310 in sequence. The second filter 354 prevents a power component of the first frequency from entering the second matching unit 356. The second matching unit 356 performs the matching for the second high frequency power.

A gate valve 106 for opening and closing a substrate loading/unloading port 104 is provided on a sidewall of the processing chamber 102. Further, an exhaust port is provided at a bottom of the sidewall of the processing chamber 102. The exhaust port is connected with an exhaust device 109 having a vacuum pump (not shown) via an exhaust pipe 108. The inside of the processing chamber 102 is evacuated by the exhaust device 109, so that the inside of the processing chamber 102 can be maintained at a vacuum atmosphere during a plasma process.

The substrate processing apparatus 100 is connected to a controller (overall control device) 400, and respective components of the substrate processing apparatus 100 are controlled by the controller 400. Further, the controller 400 is connected with an operation unit 410 including a keyboard through which an operator inputs a command to manage the substrate processing apparatus 100, a display for visualizing and displaying an operational status of the substrate processing apparatus 100, and so forth.

Further, the controller 400 is connected with the storage 420 that stores therein, e.g., control programs for performing various processes (including a process for the wafer W and a process of measuring a distance between electrodes to be described later) in the substrate processing apparatus 100 under a control of the controller 40; and processing conditions (recipes) necessary for executing the programs.

Furthermore, these programs or the processing conditions may be stored in a hard disc or a semiconductor memory, or they may be stored in a portable computer-readable storage medium such as a CD-ROM and a DVD and they may be set at a certain address of the storage 420.

The controller 400 reads out required programs and processing conditions from the storage 420 and controls respective parts based on instructions from the operation unit 410, thereby performing a desired process in the substrate processing apparatus 100. Further, the processing conditions may be edited by the operation unit 410.

In the substrate processing apparatus 100 configured as described above, when a wafer process such as an etching process is performed, the wafer W is loaded into the processing chamber 102 by a non-illustrated transfer arm, and the wafer W is mounted on the lower electrode 310 serving as a mounting table, and the wafer W also is electrostatically attracted to and held on the electrostatic chuck 312. A processing gas is introduced into the processing chamber 102 from the processing gas supply unit 130, and the inside of the processing chamber 102 is evacuated by the exhaust device 109 to depressurize the inside of the processing chamber 102 to a certain vacuum pressure.

In this state, the first high frequency power of about 10 MHz or more, e.g., about 100 MHz is supplied from the first power supply 348 to the lower electrode 310, and the second high frequency power higher than about 2 MHz and less than about 10 MHz, e.g., about 3 MHz is supplied from the second power supply 358 to the lower electrode 310. Accordingly, plasma of a processing gas is generated between the lower electrode 310 and the upper electrode 120 by the first high frequency power. Further, a self bias potential is generated on the lower electrode 310 by the second high frequency power. Therefore, a plasma process such as reactive ion etching may be performed on the wafer W. In this way, the first and second high frequency powers are supplied to the lower electrode 310, and plasma is controlled appropriately, thereby performing a good plasma process.

When the plasma process is finished, voltage applied to the electrostatic chuck 312 turns off, and the lifter 330 is driven to lift up the wafer W by the lift pins 332 and to separate the wafer W from the electrostatic chuck 312. Then, the wafer W is unloaded from the processing chamber 102 by the not-illustrated transfer arm.

In accordance with an embodiment of the present disclosure, before the plasma process is performed on the wafer W, the upper electrode 120 is positioned at a predetermined position. Accordingly, a predetermined distance between the electrodes is adjusted based on the process condition (recipe).

Due to the repetitive processes for the wafers W, the electrode plate 124 of the upper electrode 120 may be worn out and its thickness becomes thin, and, thus, a distance between the electrodes is varied. A variation of distance between the electrodes may have an adverse effect on the process of wafer W. In this reason, the consumption amount of the electrode plate 124 of the upper electrode 120 may be calculated based on an accumulated process time for the wafer W, but in recent years, the process for the wafer W is complicated, which makes it difficult to calculate the consumption amount.

Therefore, in accordance with the embodiment of the present disclosure, the variation of distance between electrodes is measured by using the lifter 330. Since a distance between the electrodes can be directly measured, the measurement can be performed exactly. Further, it is not needed to additionally install a unit for measuring a distance between the electrodes, and, thus, the configuration of the apparatus is not complicated and the manufacturing cost can be reduced.

Figure 2A:
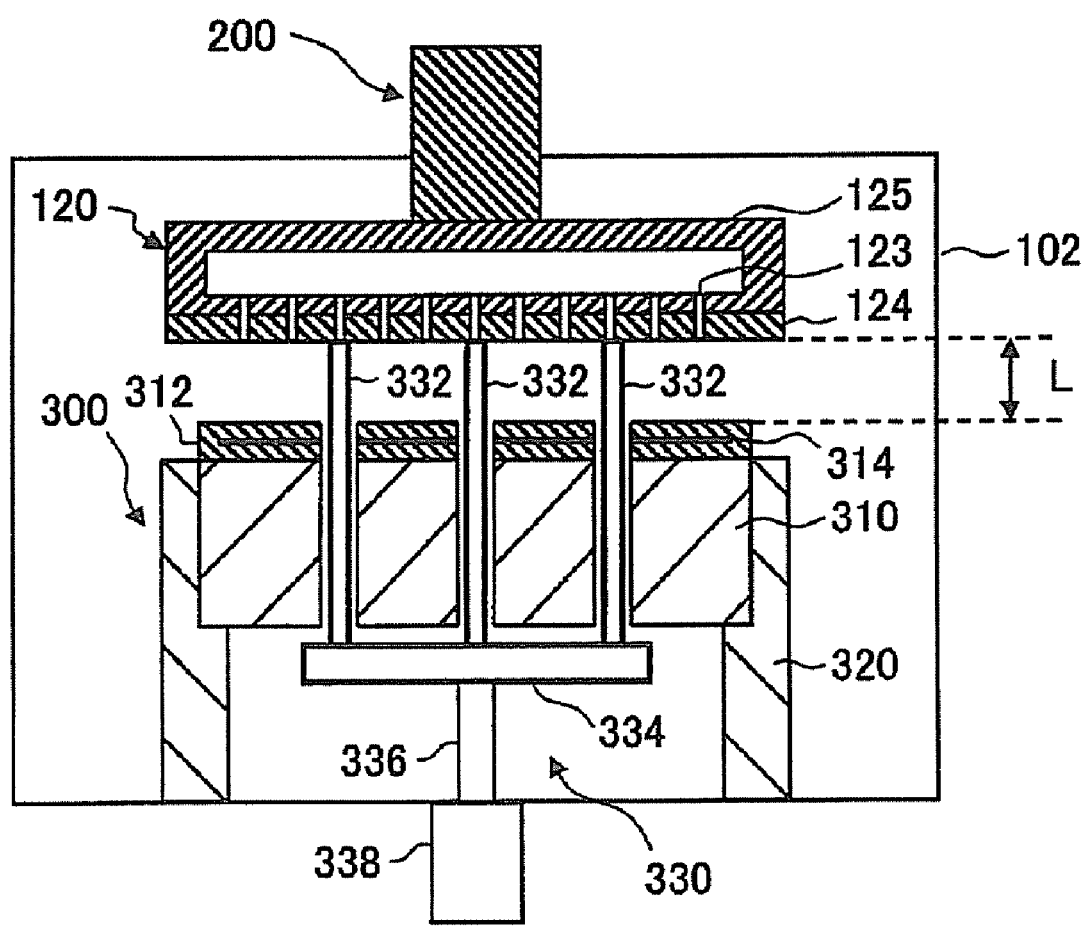
FIG. 2A is a view for describing a measuring principle for a distance between electrodes in accordance with an embodiment of the present disclosure before the electrode is worn out.
Figure 2B:
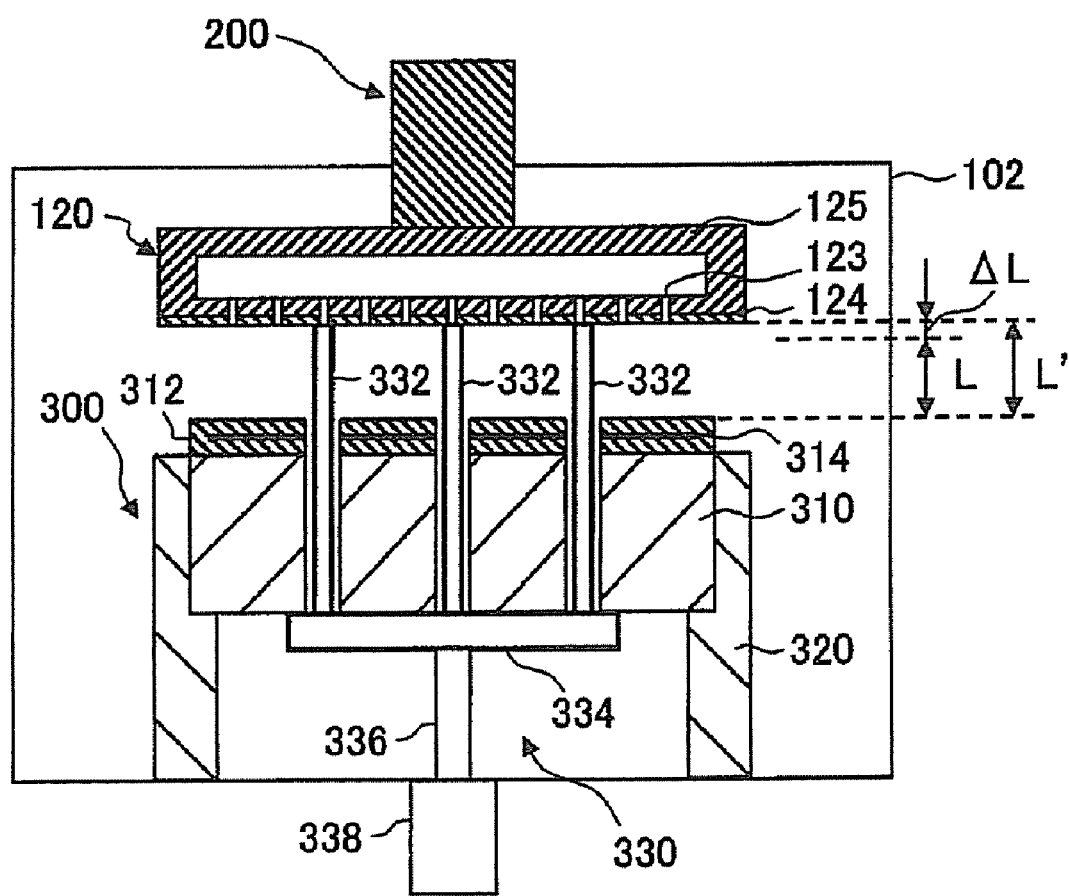
FIG. 2B is a view for describing the measuring principle for a distance between the electrodes in accordance with an embodiment of the present disclosure after the electrode is worn out.

Hereinafter, the measuring principle for a distance between electrodes by using the lifter 330 will be described below by referring to the drawings. FIGS. 2A and 2B are a view for describing the measuring principle for a distance between electrodes. Further, FIGS. 2A and 2B schematically illustrate a part of the configuration shown in FIG. 1.

As shown in FIG. 2A, when there is no wafer W on the lower electrode 310, the lift pin 332 is lifted up until the lift pin 332 is in contact with the upper electrode 120. Here, a moving distance of a front end of the lift pin 332 from the surface of the electrostatic chuck 312 to the upper electrode 120 becomes a distance L between electrodes. By obtaining the moving distance of the lift pin 332 (the moving distance of the lifter 330), the distance L between electrodes can be directly measured. As shown in FIG. 2B, when a bottom surface of the electrode plate 124 of the upper electrode 120 is exposed to plasma and eroded, a contact position of the front end of the lift pin 332 with the upper electrode 120 is deviated from an original contact position, and, thus, a distance between electrodes is changed to L'. Accordingly, the consumption amount ($\Delta L$) of the electrode plate 124 of the upper electrode 120 can be easily calculated by the following equation (1).

$$\Delta L = L' - L \tag{1}$$

By way of example, the moving distance of the lift pin 332 (the moving distance of the lifter 330) may be calculated based on a time duration from the beginning of the elevation of the lift pin 332 until the front end of the lift pin 332 comes into contact with the upper electrode 120. To be specific, if a relationship between a driving time of the lifter 330 and its driving distance is previously obtained, the driving time of the lifter 330 can be easily converted into its moving distance.

In this case, the moving distance of the lifter 330 can be obtained from position information of the lift pin 332 (position information of the base 334), and, for example, if a motor 338 is a DC motor having an encoder, this position information can be obtained from an encoder output of the motor 338. Further, if the motor 338 is a step motor, the position information can be obtained based on the number of steps of the motor 338.

When an elevation speed of the lifter 330 is constant, an elevation time of the lifter 330 is proportional to the moving distance thereof, thereby easily calculating the moving distance. However, the elevation speed of the lifter 330 is not necessarily maintained constant. For example, a speed of the lift pin 332 is accelerated in the beginning of the elevation thereof, and, thereafter, may decrease when the lift pin 332 is close to the upper electrode 120. Then, the speed of the lift pin 332 is maintained constant for a time duration from right before the lift pin 332 comes into contact with the upper electrode 120 until the lift pin 332 comes into contact with the upper electrode 120.

Here, a method for detecting a contact time when the lift pin 332 comes into contact with the upper electrode 120 from the beginning of the elevation of the lift pin 332 will be described in detail as follows. When the front end of the lift pin 332 is in contact with a bottom surface of the electrode plate 124 of the upper electrode 120, the lift pin 332 cannot be lifted up any more, and, thus, the lift 330 is not moved any more.

Therefore, in accordance with the embodiment of the present disclosure, as shown in FIG. 1, a lifter sensor 360 for detecting the status of the lifter 330 (e.g., a load (torque) of a motor, driving vibration of a motor, driving sound of a motor, a temperature of a motor) is provided. Then, it is detected that the lifter 330 is not moved any more after the beginning of the elevation of the lifter 330 based on an output of the lifter sensor 360, so that it is detected that the front end of the lift pin 332 is contacted with the upper electrode 120.

Figure 3:
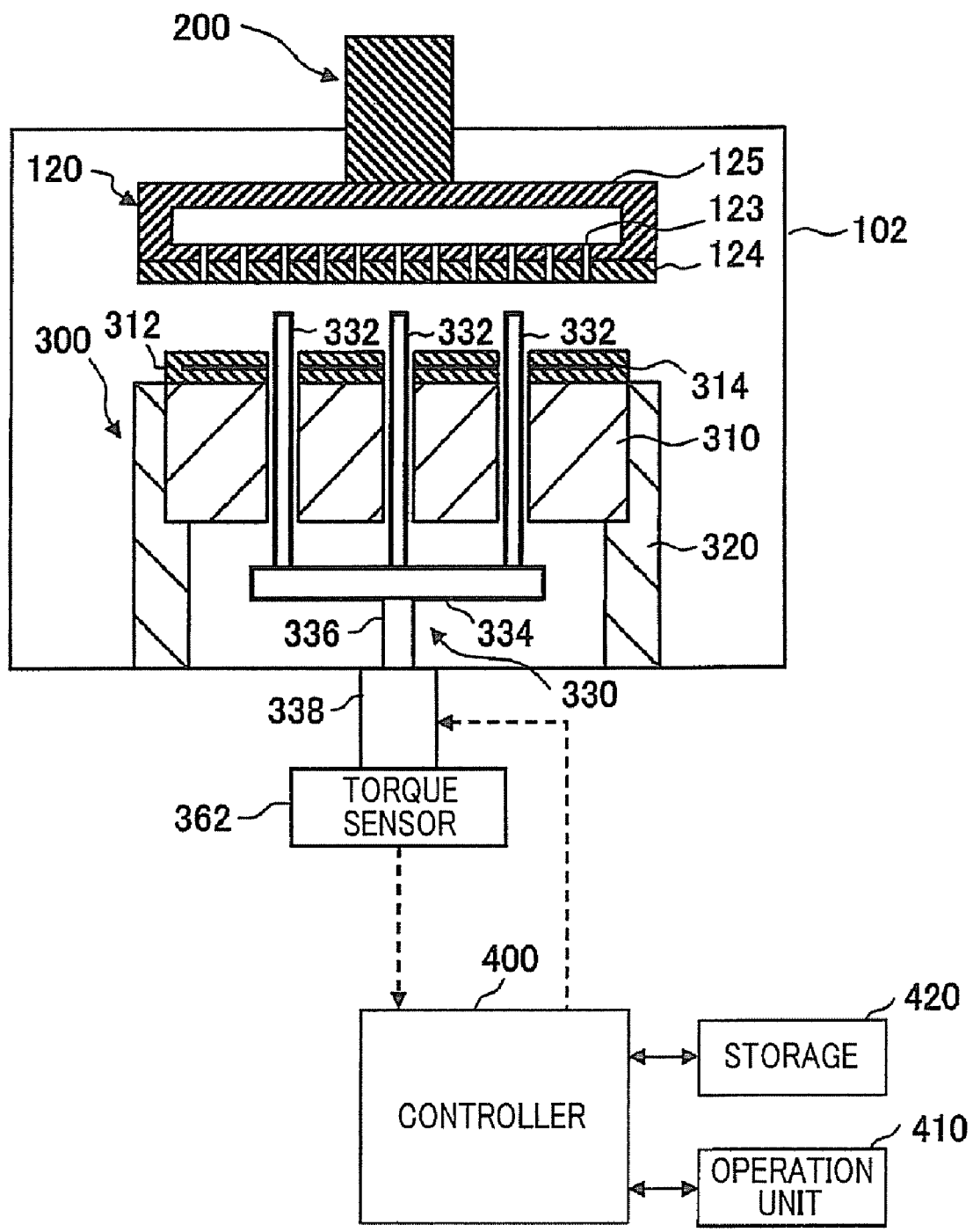
FIG. 3 illustrates a specific example when the lifter sensor shown in FIG. 1 is a torque sensor.

Hereinafter, a specific example of the lifter sensor 360 will be described by referring to the drawings. First. FIG. 3 illustrates a case of using a torque sensor 362 as the lifter sensor 360. Here, the torque sensor 362 detects a torque (load) of the motor 338 for lifting up the lifter 330. As such a torque sensor 362, a force sensor may be used.

Figure 4:
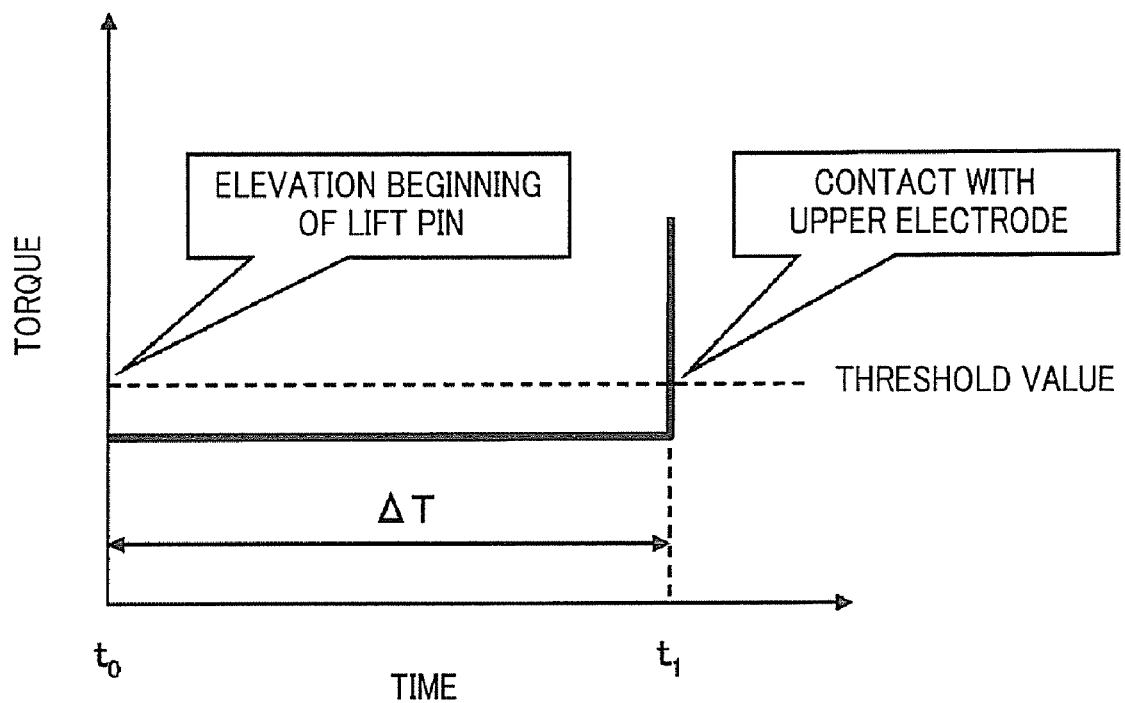
FIG. 4 is a graph illustrating a change of torque appearing when a distance between the electrodes is measured.

In order to measure a distance between electrodes, if the elevation of the lifter 330 starts, an output of the torque sensor 362 is shown in FIG. 4. That is, when the lifter 330 is lifted up while the wafer W is not mounted thereon, the torque is constant until the lift pin 332 is in contact with the upper electrode 120.

Thereafter, when the lift pin 332 is in contact with the upper electrode 120, the lift pin 332 cannot be lifted up any more. Thus, torque rapidly increases from the contact time. Accordingly, by detecting the rapid increase time of the torque, it can be detected that the lift pin 332 comes into contact with the upper electrode 120. Specifically, the controller 400 monitors an output of the torque sensor 362 from the beginning time $t_0$ when the elevation of the lift pin 332 is started, and determines a time $t_1$ when the torque exceeds a threshold value as the contact time when the lift pin 332 comes into contact with the upper electrode 120. Further, time ($\Delta T$) from $t_0$ to $t_1$ is measured as a moving time of the lift pin 332 (a moving time of the lifter 330), and this time ($\Delta T$) is converted into a moving distance of the lifter 330, i.e., a distance L between electrodes.

Figure 5:
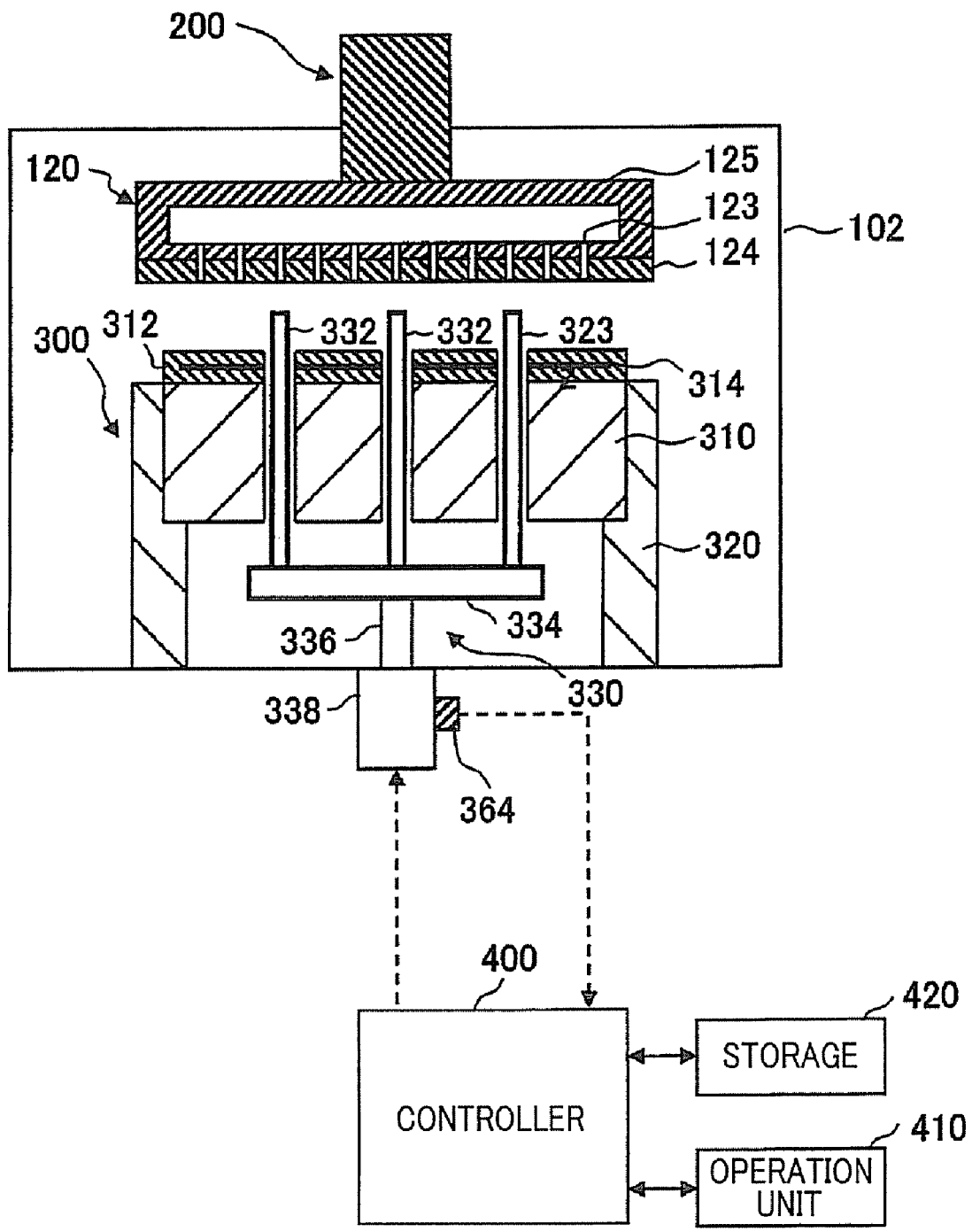
FIG. 5 illustrates a specific example when the lifter sensor shown in FIG. 1 is a motor sensor.

Method of detecting the status of the lifter 330 includes, but is not limited to, detecting the torque of the motor 338 as shown in FIG. 3. For example, as shown in FIG. 5, it may also be detected that the lift pin 332 is in contact with the upper electrode 120 by using a motor sensor 364 that detects the status (driving vibration, driving sound, temperature or the like) of the motor 338. That is, when the lift pin 332 is in contact with the upper electrode 120 and the lifter 330 is not moved, the motor 338 is also not moved. At this time, the driving vibration or driving sound is not generated in the motor 338 and a certain level of temperature increase is generated. On the contrary, when the lifter 330 moves, the motor 338 also moves, and, thus, the driving vibration or driving sound is generated in the motor 338, and a certain level of temperature increase is not generated.

Accordingly, it is detected whether the motor 338 moves or not by using the motor sensor 364 such as a vibration sensor, a sound sensor or a temperature sensor, so that it is determined whether or not the lift pin 332 is in contact with the upper electrode 120. For example, if the motor sensor 364 is the vibration sensor, the controller 400 may monitor an output of the vibration sensor from the beginning of the elevation of the lift pin 332, and determine that the lift pin 332 comes into contact with the upper electrode 120 when a driving vibration of the motor 338 is not detected any more.

Further, if the motor sensor 364 is the sound sensor, the controller 400 may monitor an output of the sound sensor from the beginning of the elevation of the lift pin 332, and determine that the lift pin 332 comes into contact with the upper electrode 120 when a driving sound of the motor 338 is not detected any more.

Furthermore, if the motor sensor 364 is the temperature sensor, the controller 400 may monitor an output of the temperature sensor from the beginning of the elevation of the lift pin 332, and when a temperature rise of the motor 338 exceeds a preset value, it can be decided that the lift pin 332 has been contacted with the upper electrode 120.

As described above, by monitoring an output of the motor sensor 364, time duration from the beginning of the elevation of the lift pin 332 until the lift pin 332 comes into contact with the upper electrode 120 can be measured, and this time duration is converted into a moving distance of the lifter 330, thereby measuring a distance between electrodes.

Figure 6:
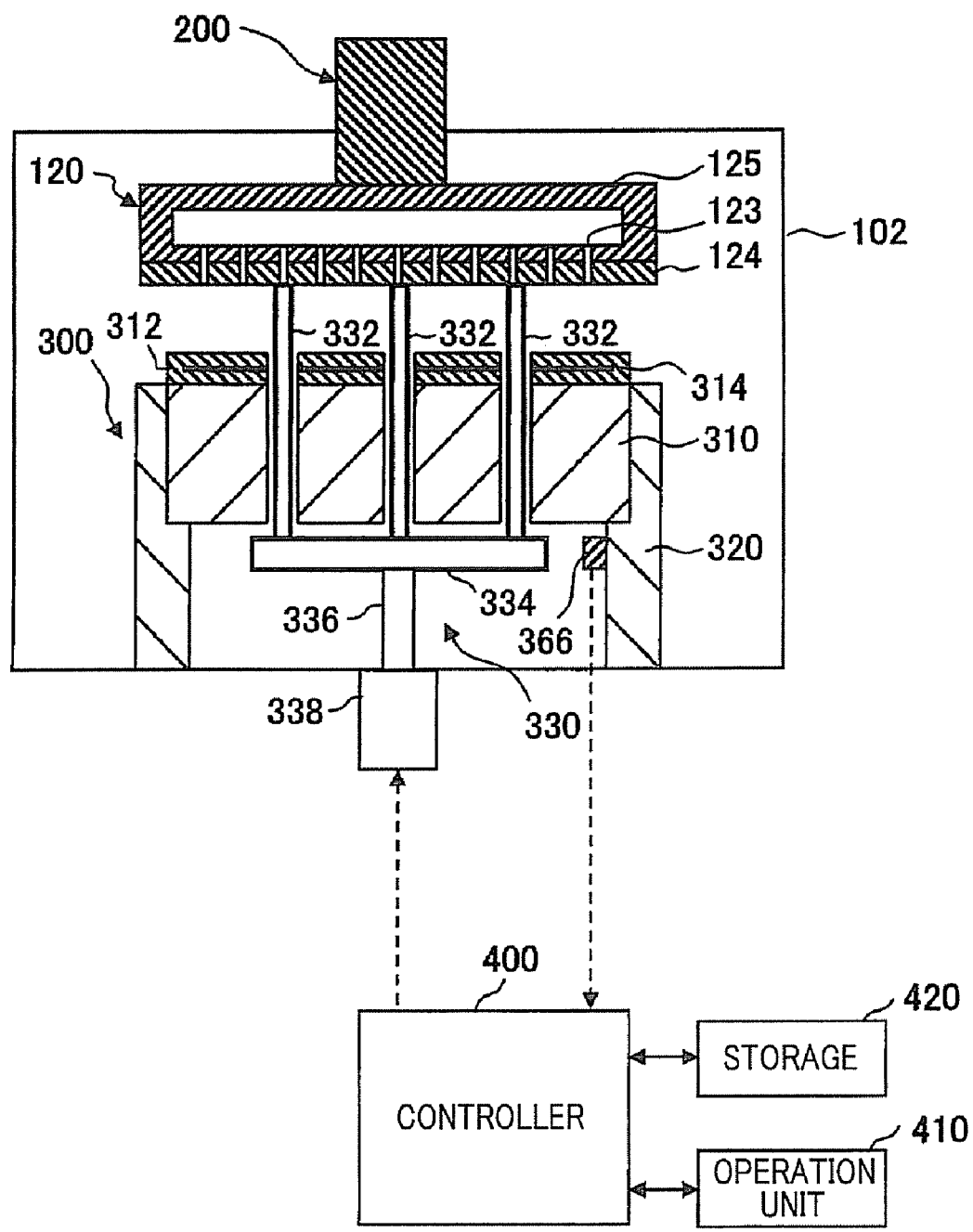
FIG. 6 illustrates a specific example when the lifter sensor shown in FIG. 1 is a position sensor.

Alternatively, as for the status of the lifter 330, a position of the base 334 may be detected directly by an optical sensor when the lift pin 332 comes into contact with the upper electrode 120. For example, as shown in FIG. 6, a position sensor 366 for detecting a position of the base 334 is provided within the cylindrical supporter 320. As the position sensor 366, for example, an optical sensor or a magnetic sensor may be used. The position sensor 366 outputs on-signal when the lift pin 332 is lifted up to a preset position to be brought into contact with the upper electrode 120.

The controller 400 monitors an output of the position sensor from the beginning of the elevation of the lift pin 332, and it is determined that the lift pin 332 is in contact with the upper electrode 120 when the position sensor outputs on-signal. Although an example case of detecting an elevated position of the base 334 has been explained in FIG. 6, it is not limited thereto. For example, a position of the lift pin 332, or a position of the rod 336 may be detected.

Alternatively, in the above-mentioned embodiments, although a distance between electrodes has been obtained based on time duration from the beginning of the elevation of the lift pin 332 until a contact time when the lift pin 332 comes into contact with the upper electrode 120, the method of obtaining a distance between electrodes is not limited thereto. For example, a distance between electrodes may be obtained by detecting a position of the lifter 330 (contact position with the upper electrode 120) at a contact time when the lift pin 332 comes into contact with the upper electrode 120.

Further, as another method of obtaining a position of the lifter 330 when the lift pin 332 is in contact with the upper electrode 120, the number of steps or an encoder output of the motor 338 may be monitored from the beginning of the elevation of the lift pin 332, and a time when the encoder output or the number of steps is not changed even after a preset time is elapsed is determined as the contact time when the lift pin comes into contact with the upper electrode 120. At this time, the position of the lifter 330 may be detected.

As described above, in accordance with the present embodiment, a distance between electrodes can be directly obtained by using lift pin. Accordingly, a position of the upper electrode 120 can be adjusted depending on a variation of a distance between electrodes, even though the electrode plate 124 is eroded. Therefore, the distance between electrodes can be maintained at a predetermined value. Moreover, the consumption amount of the electrode plate 124 of the upper electrode 120 can be detected precisely, and, thus, a more appropriate replace time of the electrode plate 124 can be known.

(Specific Example of Process for Measuring Distance Between Electrodes)

Figure 7:
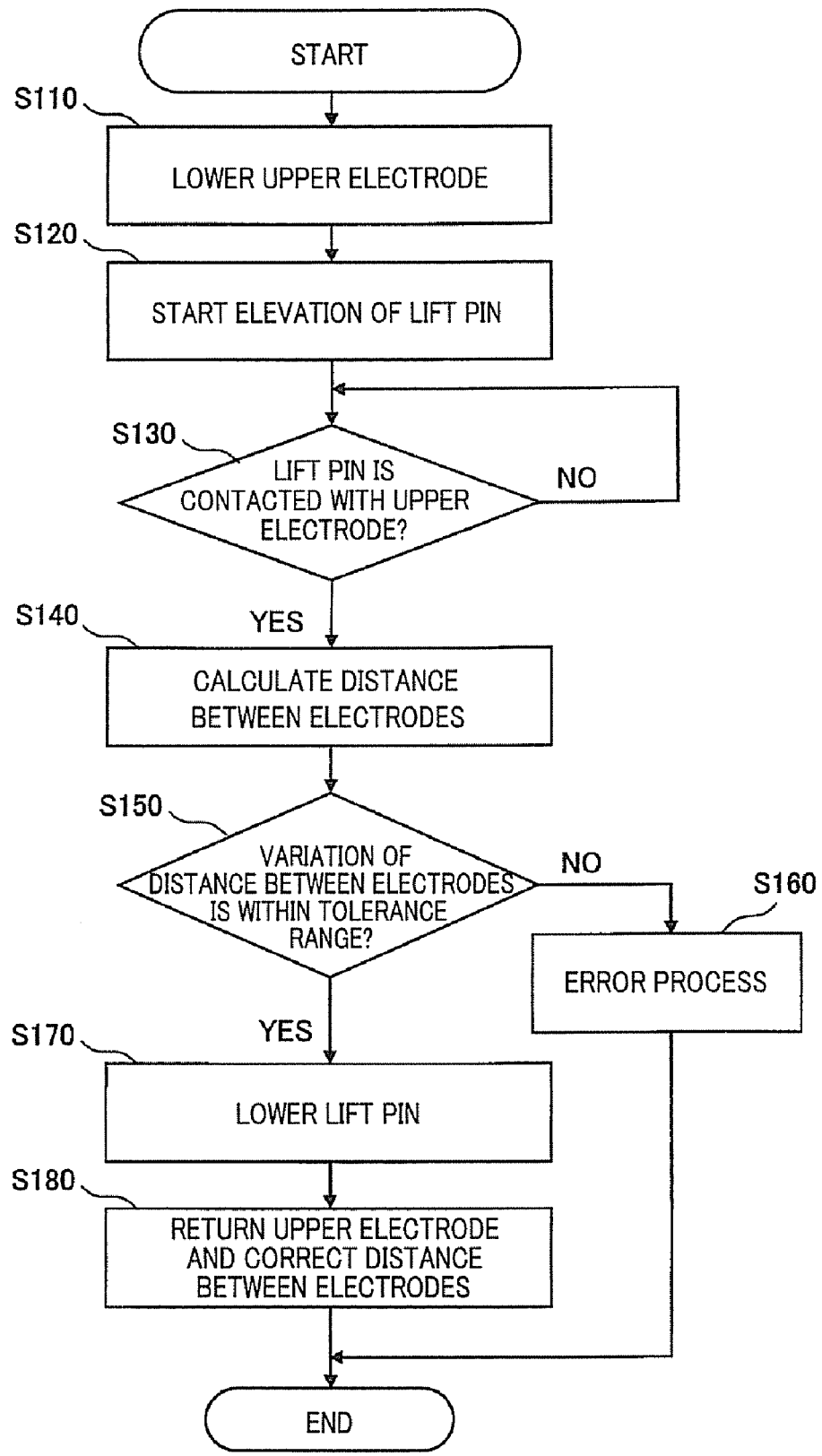
FIG. 7 is a flowchart illustrating a specific example of a process of measuring a distance between the electrodes in accordance with an embodiment of the present disclosure.
Figure 8A:
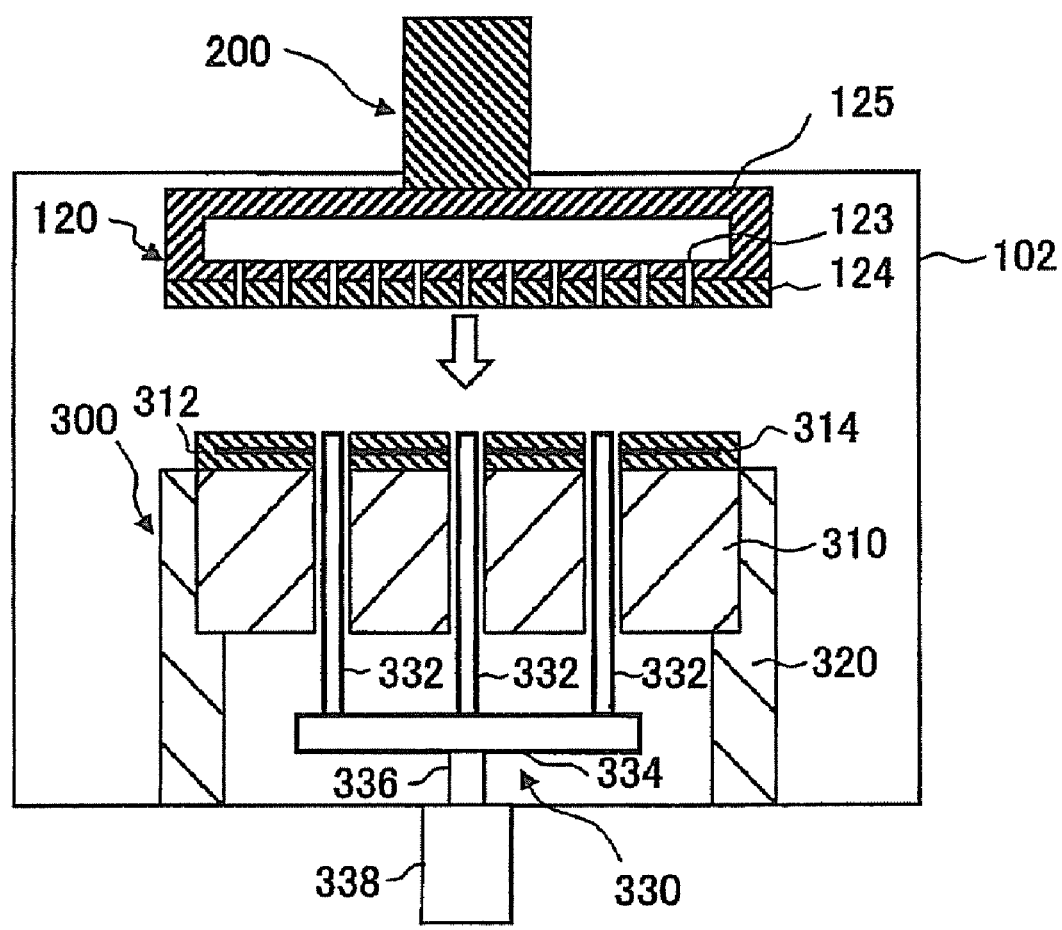
FIG. 8A illustrates operations of processes for measuring a distance between the electrodes in accordance with an embodiment of the present disclosure.
Figure 8B:
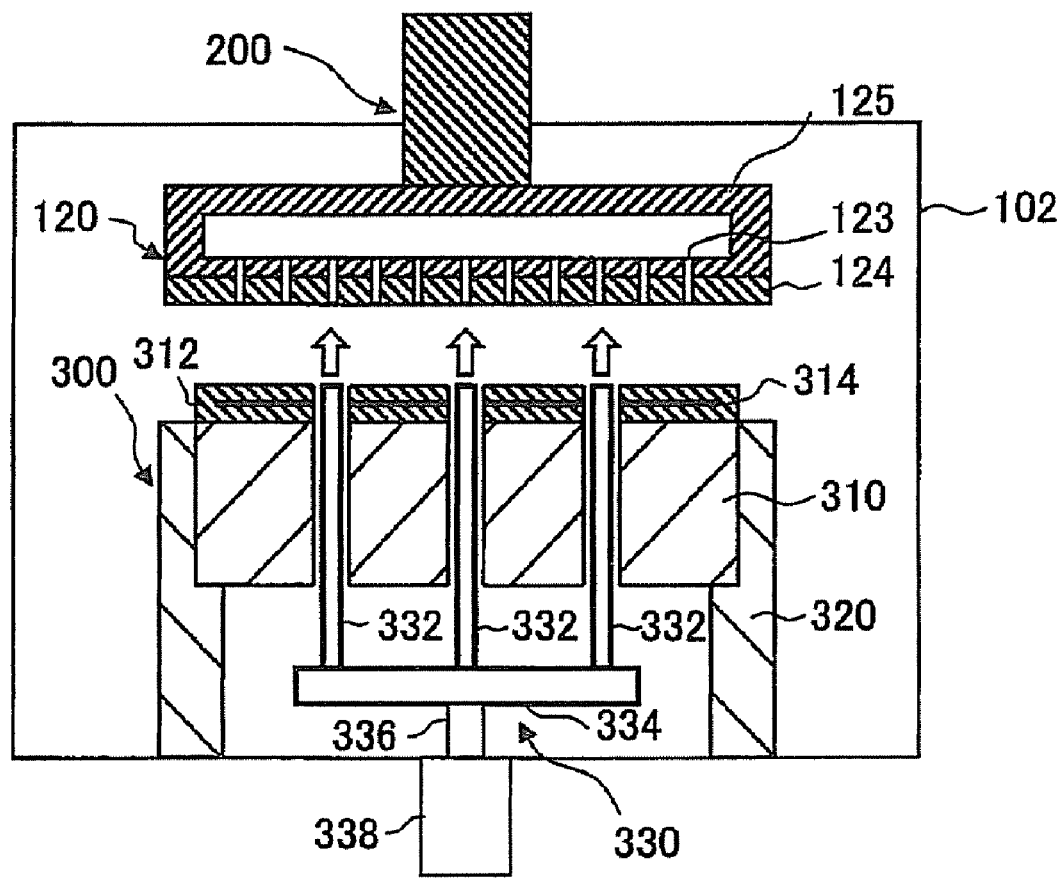
FIG. 8B illustrates the next operations to FIG. 8A.
Figure 8C:
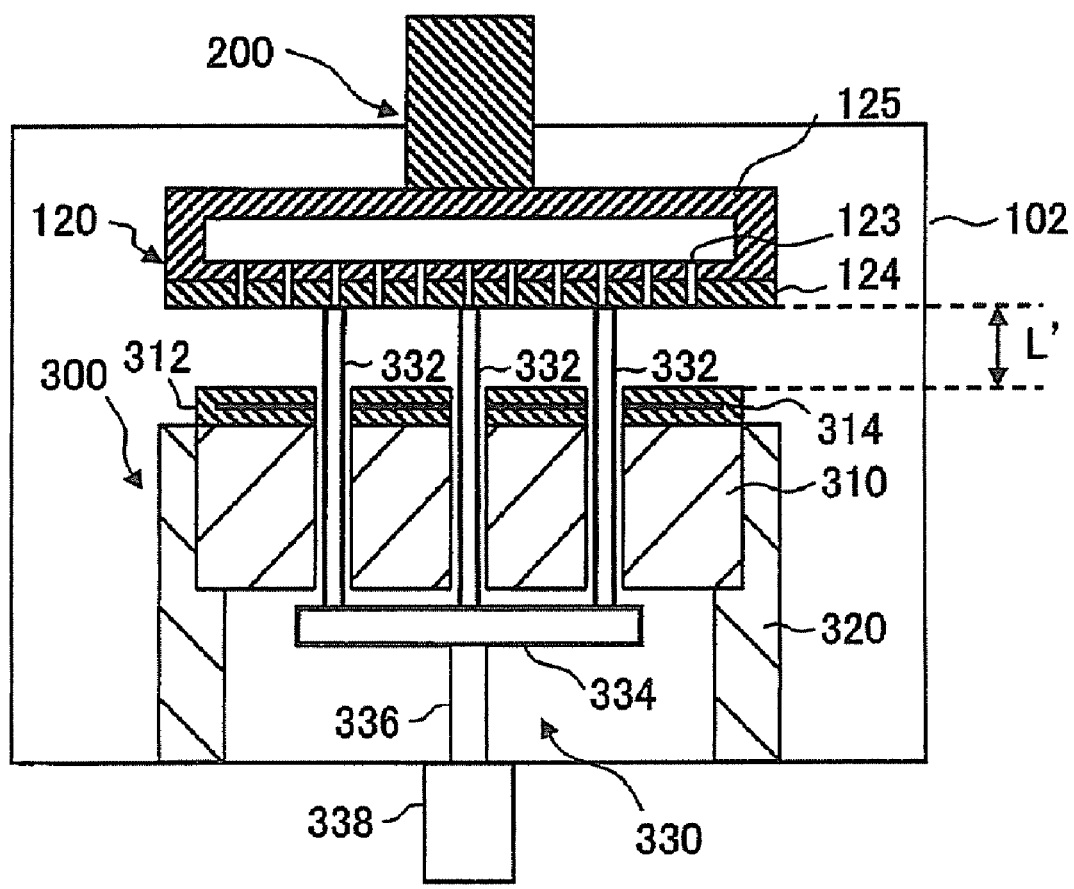
FIG. 8C illustrates the next operations to FIG. 8B.

Subsequently, as described above, a specific example of a process of measuring a distance between electrodes by using the lifter 330 is described by referring to the drawings. FIG. 7 is a flowchart of a main routine schematically illustrating a process of measuring a distance between electrodes in accordance with the present embodiment. FIGS. 8A to 8C illustrate operations of processes for measuring a distance between electrodes. The process of measuring a distance between electrodes is performed by the controller 400 based on a program stored in the storage 420 after a processed wafer W is unloaded from the processing chamber 102.

In the process for measuring a distance between electrodes as shown in FIG. 7, in step S110, the upper electrode 120 is lowered to a lowermost position (FIG. 8A). In this way, since the upper electrode is lowered to the lowermost position before a measurement process, the moving distance of the lifter 330 can become shortest in the measurement process. Whenever the measurement process is performed, if the upper electrode 120 is lowered to the same position, the consumption amount of the electrode plate 124 of the upper electrode 120 can be accurately measured. Thus, the upper electrode 120 need not be lowered to the lowermost position.

Subsequently, in step S120, the motor 338 of the lifter 330 is driven to lift up the lift pin 332 (FIG. 8B), and the status of the lifter 330 is monitored by the lifter sensor 360. Then, in step S130, it is determined whether the lift pin 332 comes into contact with the upper electrode 120 based on the status of the lifter 330.

In case that it is determined in the step S130 that the lift pin 332 comes into contact with the upper electrode 120, a distance L' between electrodes is obtained in step S140 (FIG. 8C). For example, when the status of the lifter 330 is monitored by the torque sensor 36, a moving distance of the lifter 330 from a reference position of the lifter 330 until the time when a torque exceeds a threshold value as shown in FIG. 4 is obtained as the distance between electrodes. Then, the measured distance L' between electrodes may be stored in the storage 420 as history information.

Then, in step S150, it is determined whether or not a variation of a distance between electrodes (ΔL shown in FIG. 2B) is within a tolerance range. For example, the measured distance L' between electrodes is compared with a predetermined distance (L shown in FIG. 2B) between electrodes, and it is determined whether the variation is within a predetermined tolerance range. In the step S150, if it is determined that the variation of the distance between electrodes is within the tolerance range, the lift pin 332 is lowered in step S170. Then, in step S180, the upper electrode 120 returns to its original position, and a position of the upper electrode 120 is corrected based on the variation of the distance between electrodes and, finally, a series of measurement processes is completed. Accordingly, although the electrode plate 124 is eroded, the distance between electrodes can be corrected to the predetermined distance.

In contrast, in the step S150, if it is determined that the variation of the distance between electrodes exceeds the tolerance range, it is regarded that the electrode plate 124 has been eroded enough to replace the electrode plate with a new one. Therefore, in step S160, an error process is performed and a series of processes for measuring the distance between electrodes is finished. Here, the error process may be a display process for a replacement of the electrode plate 124 or an alert process such as alarm.

As described above, in accordance with the present embodiment, a distance between electrodes can be directly obtained by using lifter 330. Accordingly, a position of the upper electrode 120 can be adjusted depending on a variation of a distance between electrodes, even though the electrode plate 124 is eroded. Therefore, the distance between electrodes can be maintained at a predetermined value. Moreover, the consumption amount of the electrode plate 124 of the upper electrode 120 can be detected precisely, and, thus, a more appropriate replace time of the electrode plate 124 can be known.

Further, a process for measuring a distance between electrodes may be carried out whenever a process for a single sheet of wafer W is finished or whenever a process for a preset number of wafers W (for example, 25 sheets of wafers for one lot) is finished. Furthermore, a cumulative time during which a high frequency power has been applied is stored in the storage 420, and a process for measuring a distance between electrodes may be performed every a predetermined cumulative time.

In addition, when a process for the wafer W is performed under a plurality of process conditions, a process interval for measuring a distance between electrodes may be varied based on the process conditions. Further, it is desirable that a process for measuring a distance between electrodes may be carried out after a cleaning process for the processing chamber 102 is finished. Then, particles such as reaction products adhering to the upper electrodes 120 are removed by the cleaning process, thereby preventing particles from adhering to the lift pin 332 when the lift pin 332 is in contact with the upper electrode 120.

In the process for measuring a distance between electrodes shown in FIG. 7, although the example case of lowering the upper electrode 120 before the measurement process has been described, it is not limited thereto. The distance between electrodes may be measured in their original position, without lowering the upper electrode 120.

Figure 9:
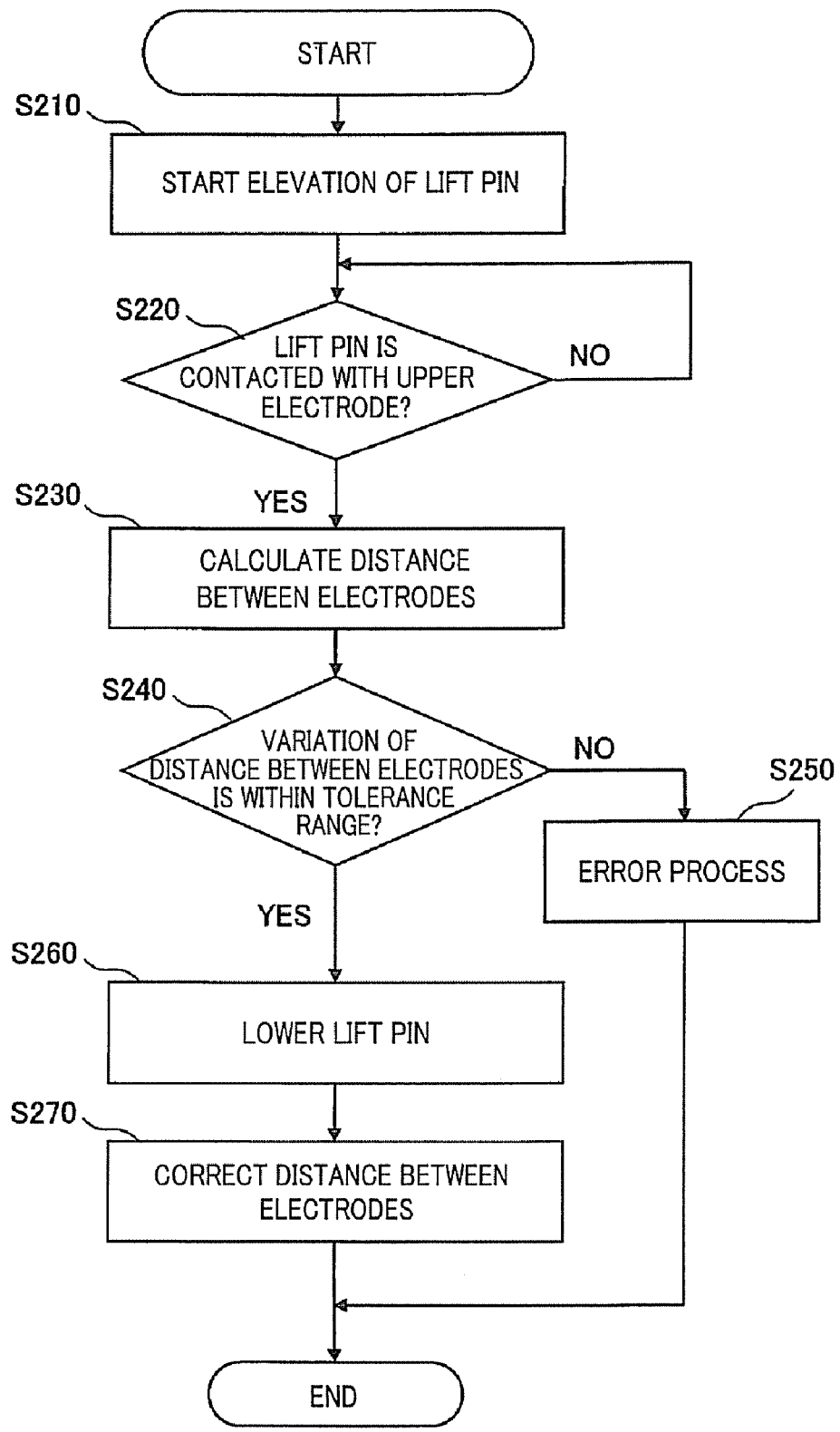
FIG. 9 is a flowchart illustrating a specific example of a process of measuring a distance between the electrodes in accordance with an embodiment of the present disclosure.

FIG. 9 provides a specific example of process for measuring a distance between electrodes without lowering the upper electrode 120. In the measurement process shown in FIG. 9, the wafer W is unloaded from the processing chamber 102, and then a position of the upper electrode 120 is still in its original position. First, in step S210, the motor 338 of the lifter 330 is driven to lift up the lift pin 332, and the status of the lifter 330 is monitored by the lifter sensor 360. Then, in step S220, it is determined whether the lift pin 332 comes into contact with the upper electrode 120 based on the status of the lifter 330.

In case that it is determined in the step S220 that the lift pin 332 comes into contact with the upper electrode 120, in the same manner as in the steps S140 and S150 shown in FIG. 7, a distance between electrodes is obtained in step S230. In step S240, it is determined whether or not a variation of a distance between electrodes is within a tolerance range. In the step S240, it is determined that the variation of the distance between electrodes is within the tolerance range, the lift pin 332 lowered in step S260. In step S270, a position of the upper electrode 120 is corrected based on the variation of the distance between electrodes and, finally, a series of measurement processes is completed.

In contrast, in the step S240, if it is determined that the variation of the distance between electrodes exceeds the tolerance range, it is regarded that the electrode plate 124 has been eroded enough to replace the electrode plate 124 with a new one. Therefore, in step S250, an error process is performed and a series of processes for measuring the distance between electrodes is finished as in the step S160.

There have been explained the embodiments of the present invention in detail with reference to the accompanying drawings, but it is clear that the above-described embodiments are illustrative in all aspects and do not limit the present invention. It would be understood by those skilled in the art that various changes and modifications may be made without changing technical conception and essential features described in the following claims and their equivalents are included in the scope of the present invention.

In accordance with the present embodiment, for example, although it is described that the present disclosure is applied to a substrate processing apparatus capable of adjusting a position of the upper electrode, it is not limited thereto. The process for measuring a distance between electrodes in accordance with the embodiment of the present disclosure is applicable to a substrate processing apparatus an upper electrode of which position is fixed. In this case, the step S270 (correcting a distance between electrodes) shown in FIG. 9 may be omitted because a distance between electrodes cannot be corrected. Further, the process for measuring a distance between electrodes in accordance with the present disclosure is also applicable to a substrate processing apparatus capable of moving up and down a lower electrode. In this case, in the step S270 shown in FIG. 9, a distance between electrodes may be adjusted by correcting a position of the lower electrode.

Moreover, in the embodiment of the present disclosure, although it has been described that, as a substrate processing apparatus, a plasma processing apparatus in which plasma is generated by applying double high frequency powers to only a lower electrode, the present disclosure is not limited thereto. It may be also applicable to other apparatus such as a plasma processing apparatus in which a single high frequency power is applied to only a lower electrode or double high frequency powers are applied to an upper electrode and a lower electrode, respectively. Further, the substrate processing apparatus applicable to the present disclosure is not limited to a plasma processing apparatus, but it is applicable to a heat treatment apparatus for performing a film formation by using plasma formed between parallel plate electrodes.

The present disclosure may be applicable to a substrate processing apparatus that performs a plasma process on a substrate by generating plasma between electrodes facing each other and also relates to a method for measuring a distance between the electrodes and a storage medium storing a program.

What is claimed is:

1. A method for measuring a distance between an upper electrode and a lower electrode provided within a processing chamber to face each other in a substrate processing apparatus that performs a preset process on a substrate mounted on the lower electrode by applying a high frequency power between the electrodes and generating plasma of a preset gas, wherein the substrate processing apparatus includes:
a lift pin that is protrusible from and retractable below the lower electrode and lifts up the substrate to be separated from the lower electrode; and
a lifter that elevates the lift pin up and down, further wherein the method comprises:
elevating the lift pin upward and bringing the lift pin into contact with the upper electrode by driving the lifter while the substrate is not mounted on the lower electrode and measuring a distance between the upper electrode and the lower electrode based on a moving distance of the lifter; and
correcting a position of the upper electrode by lowering the upper electrode as much as a reduced thickness of the upper electrode that has been worn out due to exposure of the upper electrode to the plasma during the preset process.

2. The method of claim 1, wherein the substrate processing apparatus further includes a driving mechanism that elevates the upper electrode up and down, and a position of the upper electrode is corrected by controlling the driving mechanism to adjust the distance between the electrodes to a preset distance previously stored in a storage unit based on the measured distance between the electrodes.

3. The method of claim 2, wherein in measuring the distance between the electrodes, the distance between the electrodes is measured by elevating the lift pin upward after the upper electrode is lowered to a preset position, and the upper electrode is returned to an original position and the position of the upper electrode is corrected.

4. The method of claim 2, wherein a variation of the measured distance between the electrodes from the preset distance is calculated, and it is determined whether the variation is within a tolerance range, and the position of the upper electrode is corrected only when the variation is within the tolerance range.

5. The method of claim 2, wherein a variation of the measured distance between the electrodes from the preset distance is calculated, and it is determined whether the variation is within a tolerance range, and an alarm is activated when the variation exceeds the tolerance range.

6. The method of claim 1, wherein the substrate processing apparatus further includes a lifter sensor that detects a status of the lifter, and
the method further comprises:
in measuring the distance between the electrodes, monitoring an output of the lifter sensor from the beginning of the elevation of the lift pin and detecting a contact time when the lift pin comes into contact with the upper electrode based on a variation of the output of the lifter sensor,
wherein the moving distance of the lifter is measured based on a time duration from the beginning of the elevation of the lift pin until the detected contact time.

7. The method of claim 6, wherein the lifter includes a base that supports the lift pin and a motor that elevates the base up and down,
the lifter sensor is a torque sensor that detects a load torque of the motor, and
in detecting the contact time, an output of the torque sensor is monitored from the beginning of the elevation of the lift pin, and a time when the torque of the motor rapidly increases is determined as the contact time when the lift pin comes into contact with the upper electrode.

8. The method of claim 6, wherein the lifter includes a base that supports the lift pin and a motor that elevates the base up and down,
the lifter sensor is a vibration sensor that detects a driving vibration of the motor, and
in detecting the contact time, an output of the vibration sensor is monitored from the beginning of the elevation of the lift pin, and a time when the driving vibration of the motor is not detected any more is determined as the contact time when the lift pin comes into contact with the upper electrode.

9. The method of claim 6, wherein the lifter includes a base that supports the lift pin and a motor that elevates the base up and down,
the lifter sensor is a sound sensor that detects a driving sound of the motor, and
in detecting the contact time, an output of the sound sensor is monitored from the beginning of the elevation of the lift pin, and a time when the driving sound of the motor is not detected any more is determined as the contact time when the lift pin comes into contact with the upper electrode.

10. The method of claim 6, wherein the lifter includes a base that supports the lift pin and a motor that elevates the base up and down,
the lifter sensor is a temperature sensor that detects a temperature of the motor, and
in detecting the contact time, an output of the temperature sensor is monitored from the beginning of the elevation of the lift pin, and a time when a temperature rise of the motor exceeds a preset value is determined as the contact time when the lift pin comes into contact with the upper electrode.

11. The method of claim 6, wherein the lifter includes a base that supports the lift pin and a motor that elevates the base up and down,
the lifter sensor is a position sensor that detects a position of the base, and
in detecting the contact time, an output of the position sensor is monitored from the beginning of the elevation of the lift pin, and a time when the position of the base reaches a preset raised position is determined as the contact time when the lift pin comes into contact with the upper electrode.

* * * * *